United States Patent
Masleid

(10) Patent No.: US 9,013,943 B2
(45) Date of Patent: Apr. 21, 2015

(54) STATIC RANDOM ACCESS MEMORY CIRCUIT WITH STEP REGULATOR

(71) Applicant: Oracle International Corporation, Redwood City, CA (US)

(72) Inventor: Robert P. Masleid, Monte Sereno, CA (US)

(73) Assignee: Oracle International Corporation, Redwood City, CA (US)

( * ) Notice: Subject to any disclaimer, the term of this patent is extended or adjusted under 35 U.S.C. 154(b) by 212 days.

(21) Appl. No.: 13/683,317

(22) Filed: Nov. 21, 2012

(65) Prior Publication Data

US 2014/0140147 A1    May 22, 2014

(51) Int. Cl.
*G11C 5/14*        (2006.01)

(52) U.S. Cl.
CPC ........................... *G11C 5/14* (2013.01)

(58) Field of Classification Search
CPC ................................. G11C 5/14; G11C 5/147
USPC ........................... 365/226, 154, 227, 228, 229
See application file for complete search history.

(56) References Cited

U.S. PATENT DOCUMENTS

| | | | |
|---|---|---|---|
| 6,285,213 B1 * | 9/2001 | Makino | 326/81 |
| 6,611,451 B1 * | 8/2003 | Houston | 365/154 |
| 6,925,025 B2 * | 8/2005 | Deng et al. | 365/226 |
| 7,428,164 B2 * | 9/2008 | Yamaoka et al. | 365/154 |
| 8,411,525 B2 * | 4/2013 | Swei et al. | 365/226 |
| 2011/0090753 A1 * | 4/2011 | Lee et al. | 365/226 |

* cited by examiner

*Primary Examiner* — Vanthu Nguyen
(74) *Attorney, Agent, or Firm* — Polsinelli PC

(57) ABSTRACT

Implementations of the present disclosure involve a circuit and/or method for providing a static random access memory (SRAM) component of a very large scale integration (VLSI) design, such as a microprocessor design. In particular, the present disclosure provides for an SRAM circuit that includes a step voltage regulator coupled to the SRAM circuit and designed to maintain a fixed-value voltage drop across the regulator rather than a fixed voltage across the load of the SRAM circuit. The fixed-value drop across the regulator allows the SRAM circuit to be operated at a low retention voltage to reduce leakage of the SRAM circuit while maintaining the parasitic decoupling capacitance across the power supply from the SRAM circuit to reduce power signal fluctuations. In addition, the regulator circuit coupled to the SRAM circuit may include a switch circuit to control the various states of the SRAM circuit.

11 Claims, 5 Drawing Sheets

STATIC RANDOM ACCESS MEMORY CIRCUIT WITH STEP REGULATOR

FIELD OF THE DISCLOSURE

Aspects of the present invention relate to computing systems and, more particularly, aspects of the present invention involve very large scale integration (VLSI) design, such as a microprocessor design, that incorporates static random access memory (SRAM) components.

BACKGROUND

Computers are ubiquitous in today's society. They come in all different varieties and can be found in places such as automobiles, laptops or home personal computers, banks, personal digital assistants, cell phones, as well as many businesses. In addition, as computers become more commonplace and software becomes more complex, there is a need for the computing devices to perform faster and more reliably in smaller and smaller packages.

As the design of computing systems continues to increase in complexity, certain tradeoffs are generally considered by a designer. For example, static random access memory (SRAM) circuits of a very large scale integration (VLSI) microprocessor design may provide some parasitic decoupling capacitance to the power supply. Such a decoupling capacitance may aid in stabilizing fluctuations within a power supply signal powering the design circuit. However, in some microprocessor designs, the SRAM circuit is provided with a voltage regulator that allows the SRAM circuit to operate at a lower voltage and reduce power leakage of the SRAM circuit, but also removes the beneficial decoupling capacitance aspect of the SRAM circuit. Without the parasitic decoupling capacitance of the SRAM circuits, reduction of the power supply signal may occur, thereby degrading the overall performance of the design.

Thus, techniques are described herein that provide an SRAM circuit of a VLSI design, such as a microprocessor design, that retains the beneficial parasitic decoupling capacitance of the SRAM circuit while continuing to operate the SRAM circuit at a lower voltage to combat power leakage of the SRAM circuit. It is with these and other issues in mind that various aspects of the present disclosure were developed.

SUMMARY

One implementation of the present disclosure may take the form of a circuit comprising a power supply comprising a cathode and an anode, a static random access memory circuit comprising an input and an output electrically connected to the anode of the power supply and a step voltage regulator circuit. The step voltage regulator circuit comprises an input electrically connected to the cathode of the power supply and an output electrically connected to the input of the static random access memory circuit, the step voltage regulator configured to provide a constant voltage drop across the step voltage regulator referenced to a voltage level at the input of the step voltage regulator. Further, the voltage across the static random access memory circuit varies with reference to variations of a power signal provided by the power supply.

Another implementation of the present disclosure may take the form of a computer system comprising at least one processor, a power supply comprising a positive terminal and a negative terminal and at least one memory unit coupled to the processor. The memory unit comprises a static random access memory circuit comprising an input and an output electrically connected to the negative terminal of the power supply and a step voltage regulator circuit. The step voltage regulator circuit comprises an input electrically connected to the positive terminal of the power supply and an output electrically connected to the input of the static random access memory circuit, the step voltage regulator configured to provide a constant voltage drop across the step voltage regulator referenced to a voltage level at the input of the step voltage regulator. Further, the voltage across the static random access memory circuit varies with reference to variations of a power signal provided by the power supply.

Yet another implementation of the present disclosure may take the form of a circuit comprising a power supply comprising a cathode and an anode, a static random access memory circuit comprising an input electrically connected to the cathode of the power supply and an output and a step voltage regulator circuit. The step voltage regulator circuit comprises an input electrically connected to the output of the static random access memory circuit and an output electrically connected to the anode of the power supply, the step voltage regulator configured to provide a constant voltage drop across the step voltage regulator referenced to a voltage level at the output of the step voltage regulator. Further, the voltage across the static random access memory circuit varies with reference to variations of a power signal provided by the power supply.

DETAILED DESCRIPTION

Implementations of the present disclosure involve a circuit and/or method for providing a static random access memory (SRAM) component of a very large scale integration (VLSI) design, such as a microprocessor design. In particular, the present disclosure provides for an SRAM circuit that includes a step voltage regulator coupled to the SRAM circuit and designed to maintain a fixed-value voltage drop across the regulator rather than a fixed voltage across the load of the SRAM circuit. The fixed-value drop across the regulator allows the SRAM circuit to be operated at a low retention voltage to reduce leakage of the SRAM circuit while maintaining the parasitic decoupling capacitance across the power supply from the SRAM circuit to reduce power signal fluctuations. In addition, the regulator circuit coupled to the SRAM circuit may include a switch circuit to control the various states of the SRAM circuit.

Figure 1:
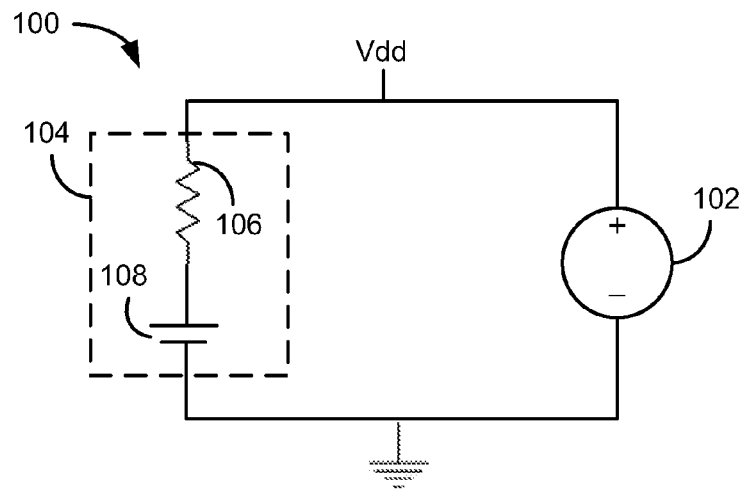
FIG. 1 is a circuit diagram representing a prior art design of a static random access memory (SRAM) device.

FIG. 1 is a circuit diagram representing a prior art design of a static random access memory (SRAM) device that may be a part of a larger VLSI design. In particular, the circuit 100 includes a power supply component 102 electrically connected to and powering a SRAM circuit 104. As used herein, the term "electrically connected" does not require a direct connection between components. Rather, electrically connected components may include one or more additional components connected between said components. The power supply 102 may be a typical power supply for a VLSI design, such as a power supply for a microprocessor of a computing system. Also, in the circuit 100 illustrated in FIG. 1, the SRAM circuit 104 is represented by a resistor 106 connected in series with a capacitor 108. In reality the SRAM circuit may include any number of components that are typically utilized to form SRAM circuits, such as decoders, memory cells, latches, registers, and the like. Those of ordinary skill in the art are aware of the various components and designs that provide SRAM circuits. However, as seen by the power supply 102 and the rest of the VLSI design, the SRAM circuit 104 provides a circuit response similar to a typical resistor-capacitor (R-C) circuit connected in series, as depicted in FIG. 1. In other words, the SRAM circuit 104 connected to a power supply 102 provides a parasitic decoupling capacitance effect to the power supply and can be represented by a resistor 106 connected in series to a capacitor 108.

The parasitic decoupling capacitance effect, in general, resists fluctuations in the power supply signal. In particular, the capacitor 108 of the representative SRAM circuit 104 charges during any rise in the power supply signal and dissipates any charge during a fall in the power supply signal. The effect of the capacitor 108 thus resists large fluctuations in the power supply signal. This resistance to fluctuations, when connected to a power supply of a VLSI design, aids in the overall performance of the VLSI design by stabilizing the power supply signal for that circuit. For example, by connecting a power supply of a microprocessor directly to a SRAM circuit, the overall performance of the microprocessor may be improved as any large fluctuations in the power supply signal are dulled through the capacitor effect of the SRAM circuit.

In many SRAM circuit designs, the SRAM circuit may include a power leakage that increases the amount of power consumed to operate the SRAM circuit. However, such undesirable SRAM voltage leakage can be reduced by decreasing the voltage applied to the SRAM circuit to a value safely above the retention voltage of the SRAM cell, but less than the operating voltage of the VLSI design. In general, an SRAM cell can retain a value at a lower level than the typical operating voltage of the VLSI design (known as "Vdd"). Operating at a lower voltage level (but above the retention voltage) provides many advantages to the SRAM cell operation, including reduction of the power consumed and power leakage. Thus, many SRAM circuit designs include a voltage regulator to reduce the operating voltage of the SRAM circuit to a level that retains the value stored in the SRAM circuit, but is lower than Vdd of the overall design.

Figure 2:
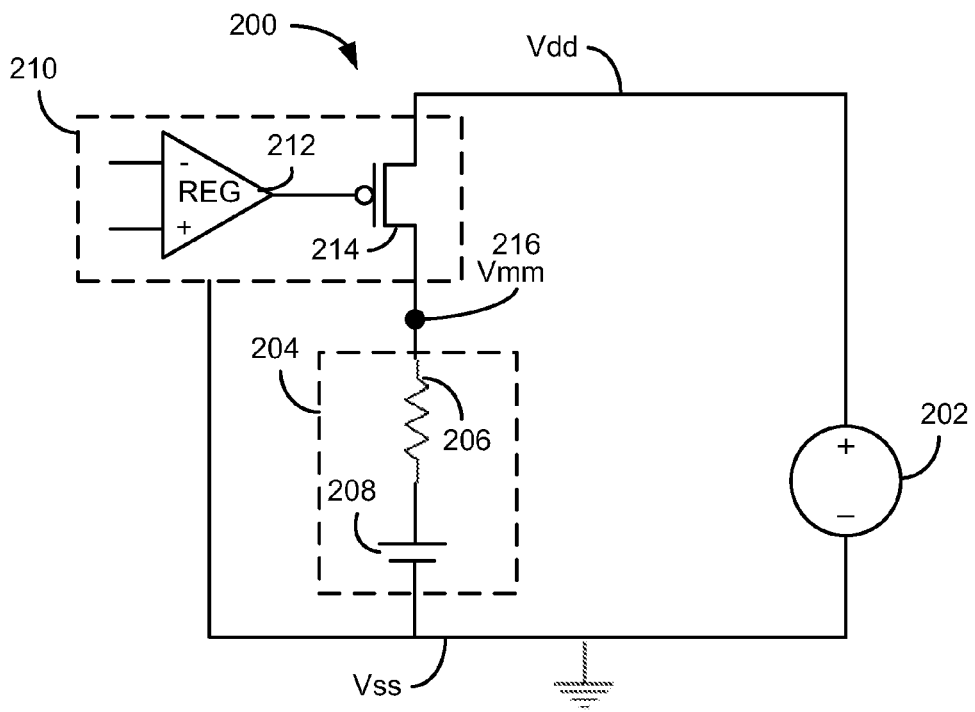
FIG. 2 is a circuit diagram representing a prior art design of a SRAM circuit with a series voltage regulator.

FIG. 2 is one example of a circuit design of a SRAM circuit with a series voltage regulator to provide a lower voltage at which the SRAM circuit 204 may operate. More particularly, the circuit 200 includes voltage regulator circuit 210 connected in series with the SRAM circuit 204 between the power supply 202 of the circuit and the SRAM circuit. As shown, the voltage regulator shown includes a regulator 212 and a transistor component 214. However, the voltage regulator circuit 210 of FIG. 2 is just a representative example of the many various types of voltage regulators that may be used to provide a constant voltage to the SRAM circuit 204 that are know to those of skill in the art.

One disadvantage of the circuit of FIG. 2 is that, regardless of the type of voltage regulator typically used, the presence of the regulator in series with the SRAM circuit removes the beneficial parasitic decoupling capacitance effect of the SRAM circuit on the power supply 202. More specifically, the voltage regulator circuit 210 is designed to provide a constant voltage to the SRAM circuit 204. Thus, the voltage across the SRAM circuit 204 (from node Vmm 216 to Vss) remains a constant voltage regardless of the fluctuations in the power signal. Rather, any voltage fluctuations in the power signal are seen in the voltage across the voltage regulator circuit 210 (from Vdd to node Vmm 216). In other words, the voltage regulator circuit 210 absorbs any power signal fluctuations and provides a constant voltage level at node Vmm 216. Thus, because the voltage across the SRAM circuit 204 (Vmm-Vss) is constant, the capacitor function 208 of the representative circuit of the SRAM does not charge or discharge to combat fluctuations in the voltage signal. Rather, the capacitor effect of the SRAM circuit 204 is nullified due to the constant voltage drop across the SRAM circuit. In this manner, the beneficial parasitic decoupling capacitance effect of the SRAM circuit 204 is removed as the voltage across the capacitor remains constant.

Figure 3:
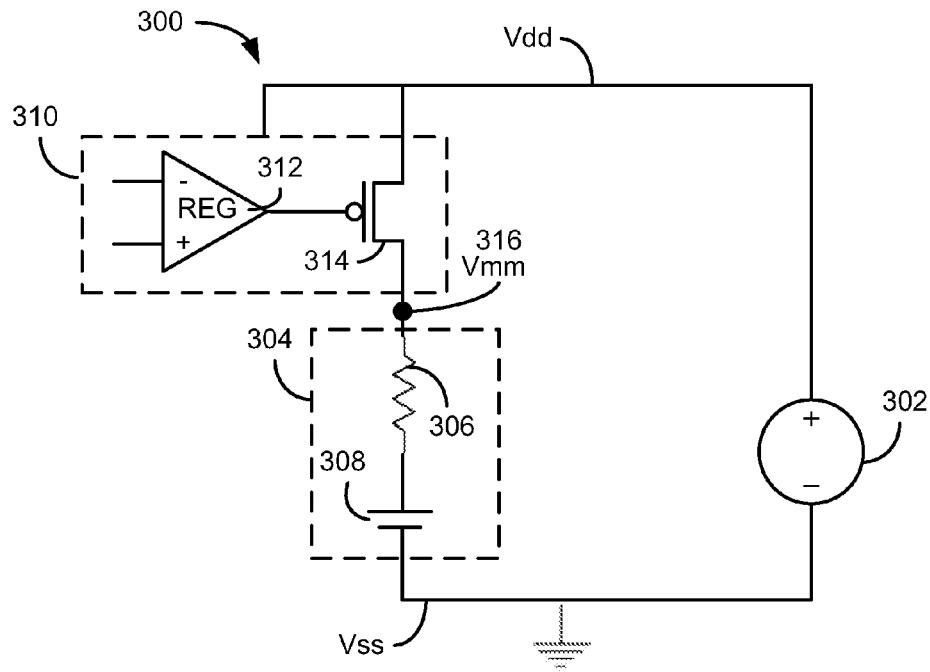
FIG. 3 is a circuit diagram representing a design of a SRAM circuit with a step regulator of the present disclosure.

To address the disadvantage of the prior art designs discussed above, a step voltage regulator may be used in place of the voltage regulator of FIG. 2 to control the voltage provided to the SRAM circuit. For example, FIG. 3 is a circuit diagram representing a circuit design 300 of a SRAM circuit 304 connected in series with a step voltage regulator 310 referenced to the power signal, or Vdd. Contrary to the voltage regulator discussed above that provides a constant voltage to node Vmm, the step regulator 310 of FIG. 3 provides a constant voltage drop across the step regulator referenced to the input voltage Vdd. Thus, the voltage at node Vmm 316 varies in relation to Vdd, rather than being a constant voltage as provided by traditional voltage regulators. In other words, the voltage across the step voltage regulator circuit 310 (Vdd-Vmm) remains constant or equal to the calculated voltage drop value of the step voltage regulator. As Vdd rises, the voltage value at node Vmm 316 also rises and as Vdd drops, the voltage at node Vmm also drops. Importantly, because the voltage at node Vmm 316 varies as referenced to Vss, the voltage measured across the SRAM circuit 304 also varies in relation to Vdd. More particularly, the voltage Vss remains constant such that changes at node Vmm 316 creates a varying voltage across the SRAM circuit 304 relative to the voltage fluctuations in the power signal.

As discussed above, traditional voltage regulators coupled to an SRAM circuit operate to provide a constant voltage across the SRAM circuit. In contrast, by replacing the voltage regulator discussed above with a step voltage regulator 310 as in FIG. 3, the voltage across the SRAM circuit 304 varies in relation to the power signal. Thus, the decoupling capacitance (represented in FIG. 3 as capacitor 308) of the SRAM circuit 304 is able to function in the circuit 300. In particular, as the voltage across the SRAM circuit 304 rises, the capacitor 308 charges to absorb the rise in the voltage. In addition, this rise in voltage across the SRAM circuit 304 is referenced to a rise in the Vdd signal. Similarly, as the voltage across the SRAM circuit 304 drops, the capacitor 308 discharges into the circuit 300. Because the voltage across the SRAM circuit 304 is referenced to Vdd, a drop in the power signal results in a drop in the voltage across the SRAM circuit. In this manner, by including a step voltage regulator circuit 310 that provides a varying voltage across the SRAM circuit 304 referenced to the power signal rather than a voltage regulator that provides a constant voltage to the SRAM circuit, the circuit 300 of FIG. 3 retains the beneficial parasitic decoupling capacitance of the SRAM circuit while also allowing the SRAM circuit to operate at a lower retention voltage value to combat power leakage of the SRAM circuit.

As shown in FIG. 3, the step voltage regulator includes a regulator 312 and a transistor component 314. However, the voltage regulator circuit 310 illustrated in FIG. 3 is merely representative of the many various types of step voltage regulators that may be used to provide a constant voltage across the SRAM circuit 304 referenced to the fluctuations of the power signal. Regardless of the step voltage regulator circuit used, the decoupling capacitance effect of the SRAM circuit 304 can be attained by provided a varying voltage across the SRAM circuit that is referenced to the power signal. One simple example of a step voltage regulator circuit is shown in FIG. 4 and discussed below.

Figure 4:
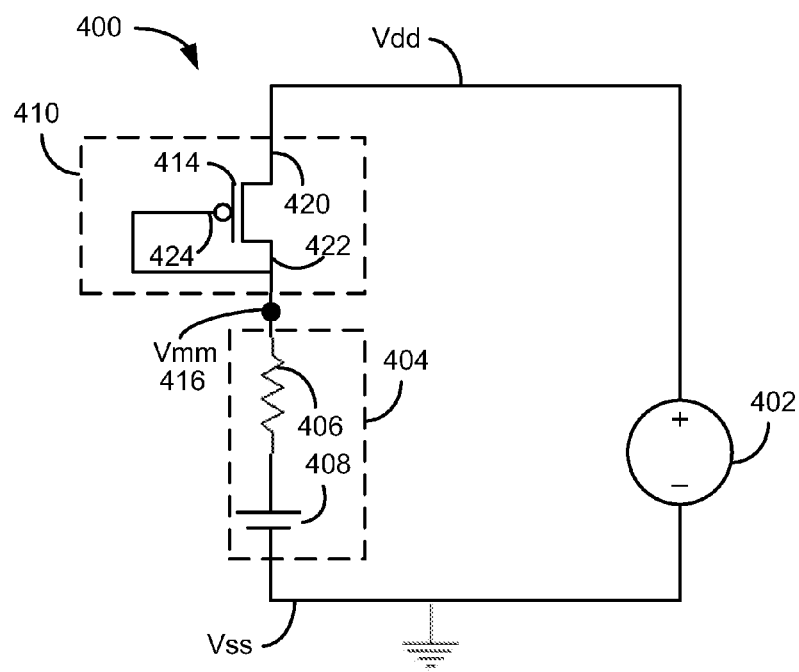
FIG. 4 is a circuit diagram representing a design of a SRAM circuit of FIG. 3 with a step regulator referenced from Vdd.

FIG. 4 is a circuit diagram representing a design of a SRAM circuit of FIG. 3 with a step regulator referenced from Vdd. In particular, the design 400 includes a power supply 402, a SRAM circuit 404 (represented by a resistor 406 and a capacitor 408) and a step voltage regulator circuit 410 connected in series. Similar to the circuit of FIG. 3, the circuit of FIG. 4 provides a constant voltage across the step voltage regulator circuit 410 and a varying voltage across the SRAM circuit 404.

The step voltage regulator circuit 410 of FIG. 4 is a simple embodiment of a step voltage regulator of the circuit of FIG. 3. In particular, the step voltage regulator circuit 410 includes a p-channel field effect transistor (PFET) 414 with a source input 420, a gate input 424 and a drain output 422. The source input 420 is electrically connected to Vdd or the positive output of the power supply 402. Also, the gate input 424 and the drain output 422 of the PFET 414 are electrically connected to node Vmm 416, which is the input to the SRAM circuit 404. This configuration provides a constant voltage drop across the PFET 414 near equal to the voltage threshold value of the PFET. The PFET 414 may be selected to include a voltage threshold that provides a voltage drop from Vdd to a voltage value just above the retention voltage for the SRAM circuit 404. Further, the threshold voltage of the PFET 414 may be selected to account for expected variance in the power signal. For example, because the voltage at node Vmm 416 nearly equals Vdd minus the threshold value of the PFET 414 Vdd may vary, Vmm may also vary. Thus, the threshold value of the PFET 414 may be selected to obtain the desired reduction in Vmm.

As noted above, operating the SRAM circuit 404 at a lower value than Vdd provides a benefit of lower power leakage by the SRAM. For example, a 30% operating voltage below Vdd decreases leakage power by about 65%. Thus, a small reduction of operating voltage to the SRAM circuit 404 provides a large reduction of power leakage from the circuit. Further, because the retention voltage of the SRAM circuit 404 is typically lower than Vdd, improvements of the power leakage of the circuit can be achieved by providing the lower voltage signal to the circuit.

Through the configuration of the circuit 400 in FIG. 4, the voltage value at node Vmm 416 is referenced to Vdd, or near equal to Vdd minus the threshold voltage of the PFET 414. Further, because the threshold value of the PFET 414 remains constant, the voltage at the drain output 422 varies in relation to the fluctuations in the power signal (Vdd). As Vdd rises, the voltage value at node Vmm 416 also rises and as Vdd drops, the voltage value at node Vmm drops accordingly.

Because the voltage at node Vmm 416 varies in reference to the fluctuations of Vdd, the voltage across the SRAM circuit 404 also varies. Further, because the voltage across the SRAM circuit 404 varies, the SRAM circuit of FIG. 4 provides a parasitic decoupling capacitance effect to the power supply 402 of the circuit 400 as illustrated by capacitor 408. Thus, the circuit of FIG. 4 provides the decoupling capacitance to the circuit 400 while also providing a lower retention voltage to the SRAM circuit 404 to combat leakage by the SRAM circuit. Again, the step voltage regulator circuit 410 is but one example of a step regulator that may be utilized to provide a varying voltage across the SRAM circuit 404 to achieve the decoupling capacitance effect in the circuit 400 while operating the SRAM circuit at a retention voltage lower than Vdd.

Figure 5:
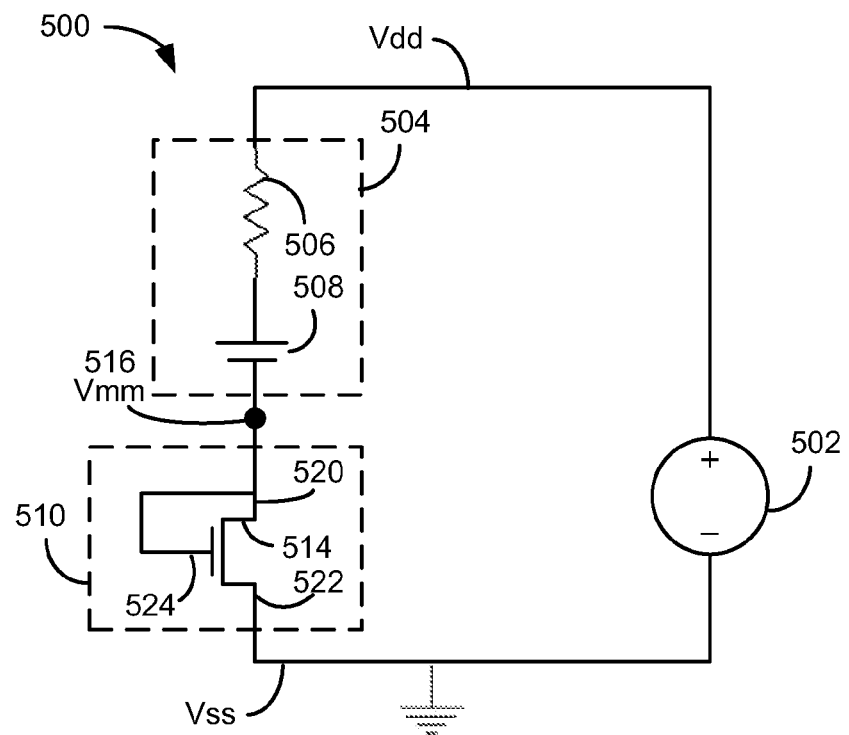
FIG. 5 is a circuit diagram representing a design of a SRAM circuit of FIG. 3 with a step regulator referenced from ground.

Further, it is not required that the SRAM circuit be between node Vmm and ground or Vss. For example, FIG. 5 is a circuit diagram representing a design of a SRAM circuit of FIG. 3 with a step regulator referenced to ground. In particular, the design 500 includes a power supply 502, a SRAM circuit 504 (represented by a resistor 506 and a capacitor 508) and a step voltage regulator circuit 510 connected in series, similar to the circuit of FIG. 4. However, in this embodiment, the SRAM circuit 504 is connected to the positive portion of the power supply 502 and the step voltage regulator circuit 510 is connected between the SRAM circuit and the negative or cathode of the power supply.

The step voltage regulator circuit 510 of FIG. 5 is another simple embodiment of a step voltage regulator that can be utilized to provide a varying voltage across the SRAM circuit 504 while operating the SRAM circuit at a retention voltage below Vdd. In particular, the step voltage regulator circuit 510 includes an n-channel field effect transistor (NFET) 514 with a source input 520, a gate input 524 and a drain output 522. The source input 520 is electrically connected to the output of the SRAM circuit 504, also shown as node Vmm 516. The gate input 524 is electrically connected to the source input 520 of the NFET 514. This configuration provides a constant voltage drop across the NFET 514 near equal to the voltage threshold value of the NFET. In this manner, the voltage value at node Vmm 516 is referenced to Vss. In other words, as Vss falls, the voltage value at node Vmm 516 also falls accordingly.

Because the voltage across the SRAM circuit 504 varies in reference to the fluctuations of Vdd, the SRAM circuit of FIG. 5 provides a parasitic decoupling capacitance effect to the power supply 502 of the circuit 500 as illustrated by capacitor 508. Thus, similar to the circuit of FIG. 4, the circuit of FIG. 5 provides the decoupling capacitance to the circuit 500 while also providing a lower retention voltage to the SRAM circuit 504 to combat leakage by the SRAM circuit. The step voltage regulator circuit 510 is but one example of a step regulator that may be utilized to provide a varying voltage across the SRAM circuit 504 to achieve the decoupling capacitance effect in the circuit 500 while operating the SRAM circuit at a retention voltage lower than Vdd.

Figure 6:
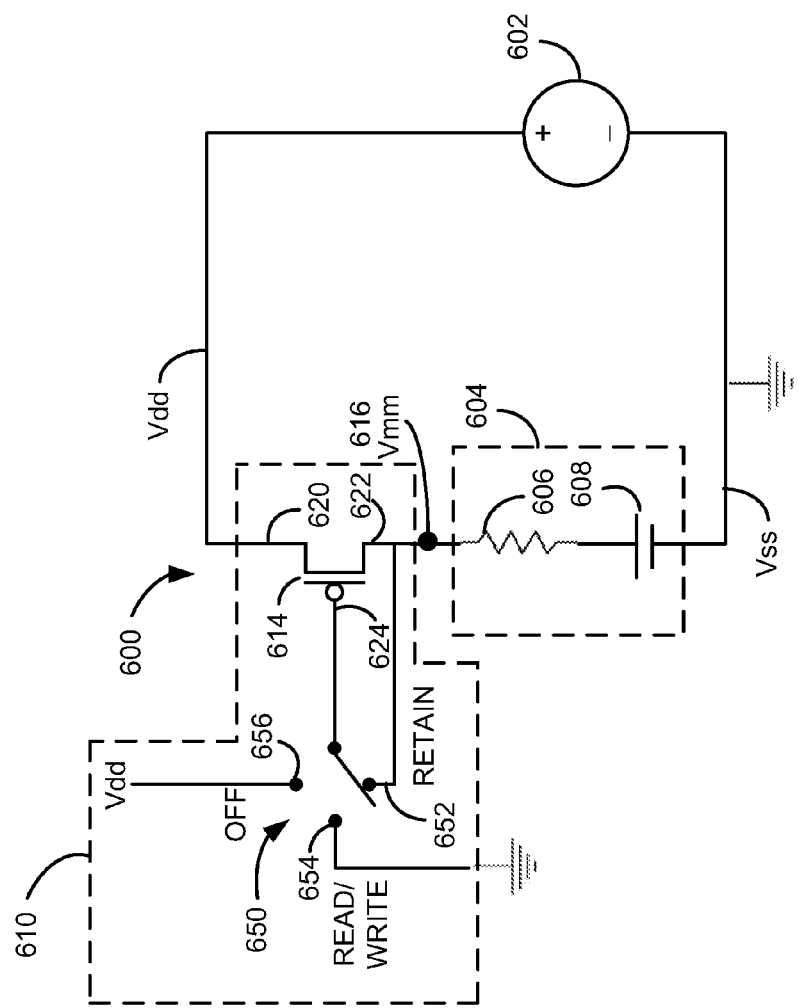
FIG. 6 is a circuit diagram representing a design of a SRAM circuit of FIG. 3 with a step regulator including a switch to provide various functionality of the SRAM circuit.

FIG. 6 is a circuit diagram representing a design of a SRAM circuit of FIG. 3 with a step regulator including a switch to provide various functionality of the SRAM circuit. More particularly, the circuit 600 of FIG. 6 is the circuit of FIG. 4 with a switch 650 incorporated into the step voltage regulator circuit. Through manipulation of the switch 650, various operating states of the SRAM circuit 604 may be selected, as explained in more detail below.

Similar to the circuit of FIG. 4, the design 600 of FIG. 6 includes a power supply 602, a SRAM circuit 604 (represented by a resistor 606 and a capacitor 608) and a step voltage regulator circuit 610 connected in series. The circuit of FIG. 6 provides a constant voltage across the step voltage regulator circuit 610 and a varying voltage across the SRAM circuit 604.

The step voltage regulator circuit 610 includes a PFET 614 with a source input 620, a gate input 624 and a drain output 622. The source input 620 is electrically connected to Vdd or the positive output of the power supply 602. The drain output 622 of the PFET 614 is electrically connected to node Vmm 616, which is the input to the SRAM circuit 604. The gate input 624 of the PFET 614 is electrically connected to an output of a switch device 650. The signal provided through the switch device 650 to the gate input 624 determines the operational state of the SRAM circuit.

In particular, the switch 650 is configured to connect the gate input 624 of the PFET 614 to three positions 652-656 of the switch. In the RETAIN position 652, the switch 650 electrically connects the gate input 624 of the PFET 614 to the drain output 622 of the PFET. In the RETAIN position 652 of the switch 650, the circuit 600 is in the form of the circuit of FIG. 4. Thus, in the RETAIN position 652, the circuit 600 operates as the circuit of FIG. 4 such that the voltage across the voltage regulator circuit is constant and the voltage across the SRAM circuit 604 is varying. Further, the voltage value at node Vmm 616 is less than the Vdd, such that the SRAM circuit 604 operates at less than Vdd but at a level above the retention voltage of the SRAM circuit. Also, in the RETAIN position 652, the circuit 600 provides a parasitic decoupling capacitance to the power supply 602 of the circuit as the voltage across SRAM circuit 604 varies, as described above.

The switch 650 also includes a READ/WRITE position 654. In this position, the switch 650 electrically connects the gate input 624 of the PFET 614 to ground. By connecting the gate input 624 to ground, the PFET 614 is biased on and the voltage value at node Vmm 616 equals or nearly equals Vdd. Thus, the SRAM circuit 604 is powered by Vdd. At this voltage, the SRAM circuit 604 can read a value stored in the SRAM or write a value to the SRAM circuit. During reads to or writes from the SRAM circuit 604, the switch 650 may be configured to the READ/WRITE position 654 to facilitate the operation of the SRAM circuit 604.

The switch 650 also includes an OFF position 656. In this position, the switch 650 electrically connects the gate input 624 of the PFET 614 to Vdd. By connecting the gate input 624 to Vdd, the PFET 614 turns off and the voltage value at node Vmm 616 drops to near zero. Thus, the SRAM circuit 604 receives no power from Vdd and enters an off state. This sleep state may be used when the value stored in the SRAM circuit 604 is not needed. Therefore, in this state, the SRAM circuit 604 loses its value as the voltage to the SRAM circuit 604 nears zero.

The switch 650 of FIG. 6 may be constructed of any number of components. For example, the switch 650 may be a transmission gate multiplexer that selects between the various positions of the switch through a voltage input. Another configuration may a feedback op-amp that is controlled by a control input voltage. In another embodiment, the voltage used to control the switch device 650 may be programmable or otherwise controllable by a program executed by a processing device. Thus, the switch device 650 may be constructed from one or more logic devices or other hardware components, a computer program or other software or a combination of both hardware and software that provides the separate inputs to the gate input 624 of the PFET 614 to select and control the various states of the SRAM circuit 604.

Figure 7:
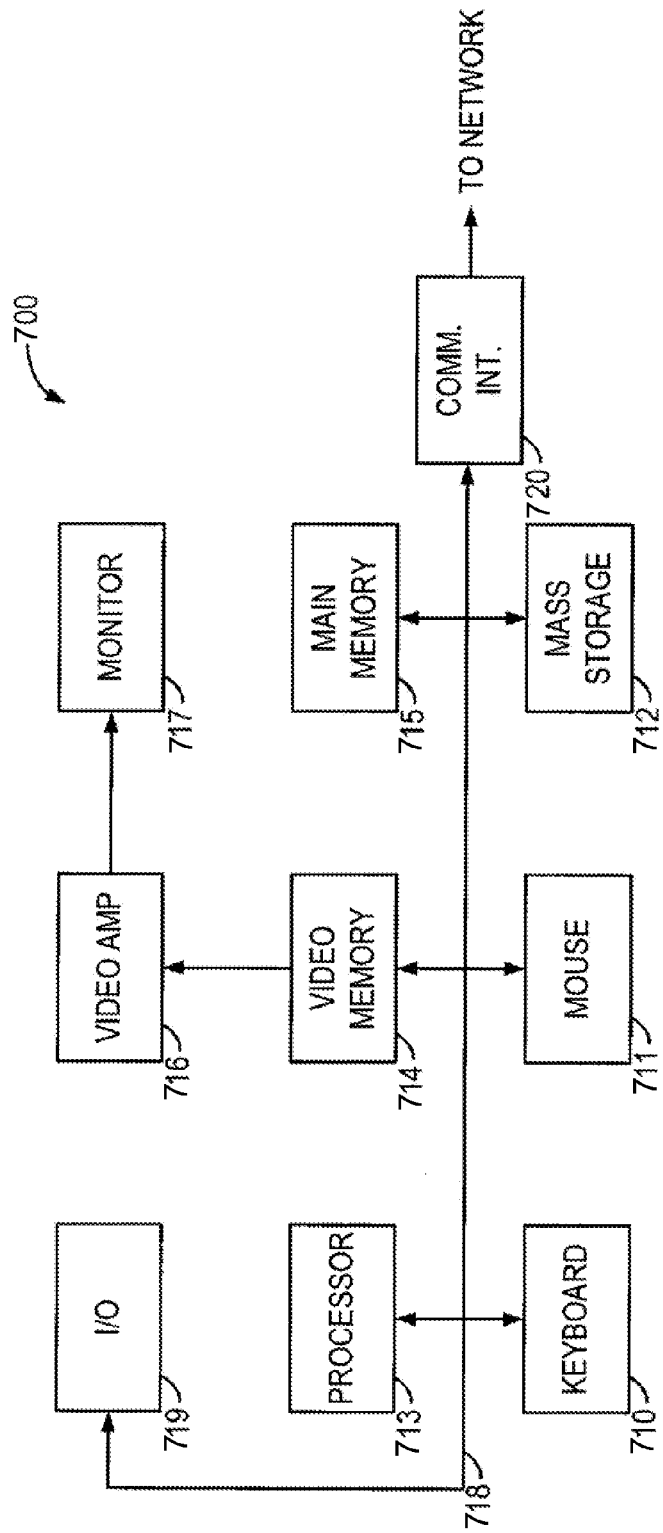
FIG. 7 is a block diagram illustrating an example of a computing system which may be used in implementing embodiments of the present disclosure.

FIG. 7 illustrates a computer system 700 capable of implementing the embodiments described herein. In some embodiments, the computer system 700 may include a microprocessor and/or memory components that incorporates one or more of the embodiments described herein. For example, the computer system 700 may be a personal computer and/or a handheld electronic device. A keyboard 710 and mouse 711 may be coupled to the computer system 700 via a system bus 718. The keyboard 710 and the mouse 711, in one example, may introduce user input to the computer system 700 and communicate that user input to a processor 713. Other suitable input devices may be used in addition to, or in place of, the mouse 711 and the keyboard 710. An input/output unit 719 (I/O) coupled to system bus 718 represents such I/O elements as a printer, audio/video (NV) I/O, etc.

Computer 700 also may include a video memory 714, a main memory 715 and a mass storage 712, all coupled to the system bus 718 along with the keyboard 710, the mouse 711 and the processor 713. The mass storage 712 may include both fixed and removable media, such as magnetic, optical or magnetic optical storage systems and any other available mass storage technology. The bus 118 may contain, for example, address lines for addressing the video memory 114 or the main memory 115. In some embodiments, the main memory 115 is a fully buffered dual inline memory module (FB-DIMM) that communicates serially with other system components.

The system bus 718 also may include a data bus for transferring data between and among the components, such as the processor 713, the main memory 715, the video memory 714 and the mass storage 712. The video memory 714 may be a dual-ported video random access memory. One port of the video memory 714, in one example, is coupled to a video amplifier 716, which is used to drive a monitor 717. The monitor 717 may be any type of monitor suitable for displaying graphic images, such as a cathode ray tube monitor (CRT), flat panel, or liquid crystal display (LCD) monitor or any other suitable data presentation device.

In some embodiments, the processor 713 is a SPARC® microprocessor from Oracle, Inc, although any other suitable microprocessor or microcomputer may be utilized. The processor 713 is described in more detail above with regard to FIGS. 1-6.

The computer system 700 also may include a communication interface 720 coupled to the bus 718. The communication interface 720 provides a two-way data communication coupling via a network link. For example, the communication interface 720 may be a local area network (LAN) card, or a cable modem, and/or wireless interface. In any such implementation, the communication interface 720 sends and receives electrical, electromagnetic or optical signals which carry digital data streams representing various types of information.

Code received by the computer system 700 may be executed by the processor 713 as it is received, and/or stored in the mass storage 712, or other non-volatile storage for later execution. In this manner, the computer system 700 may obtain program code in a variety of forms. Program code may be embodied in any form of computer program product such as a medium configured to store or transport computer readable code or data, or in which computer readable code or data may be embedded. Examples of computer program products include CD-ROM discs, ROM cards, floppy disks, magnetic tapes, computer hard drives, servers on a network, and solid state memory devices.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

What is claimed is:

1. A circuit comprising:
   a power supply comprising a cathode and an anode;
   a static random access memory circuit comprising an input and an output electrically connected to the anode of the power supply; and
   a step voltage regulator circuit comprising an input electrically connected to the cathode of the power supply and an output electrically connected to the input of the static random access memory circuit, the step voltage regulator configured to provide a constant voltage drop across the step voltage regulator referenced to a voltage level at the input of the step voltage regulator, the step voltage regulator circuit further comprising:
      a p-channel field effect transistor (PFET) comprising a source input, gate input and drain output, wherein the source input of the PFET is electrically connected to the cathode of power supply, the drain output of the PFET is electrically connected to the input of the static random access memory circuit; and
      a switch device comprising at least three inputs and an output, the output of the switch device electrically connected to the gate input of the PFET, a first input of the switch device electrically connected to the drain output of the PFET such that when the switch is in a first configuration, the gate input of the PFET is electrically connected to the drain output of the PFET, a second input of the switch device electrically connected to the cathode of the power supply such that when the switch is in a second configuration, the gate input of the PFET is electrically connected to the cathode of the power supply, and a third input of the switch device electrically connected to the anode of the power supply such that when the switch is in a third configuration, the gate input of the PFET is electrically connected to the anode of the power supply;
   wherein the voltage across the static random access memory circuit varies with reference to variations of a power signal provided by the power supply.

2. The circuit of claim 1 wherein the static random access memory circuit provides a parasitic decoupling capacitance due to the varying voltage across the static random access memory circuit.

3. The circuit of claim 1 wherein the first configuration of the switch device results in the static random access memory circuit entering a retain state.

4. The circuit of claim 1 wherein the second configuration of the switch device results in the static random access memory circuit entering a sleep state.

5. The circuit of claim 1 wherein the third configuration of the switch device results in the static random access memory circuit entering a read/write state.

6. The circuit of claim 1 further comprising a microprocessor electrically connected to the circuit, the microprocessor configured to store a value in the state random access memory circuit.

7. A computing system comprising:
   at least one processor;
   a power supply comprising a positive terminal and a negative terminal; and
   at least one memory unit coupled to the processor, wherein the at least one memory unit comprises:
      a static random access memory circuit comprising an input and an output electrically connected to the negative terminal of the power supply; and
      a step voltage regulator circuit comprising an input electrically connected to the positive terminal of the power supply and an output electrically connected to the input of the static random access memory circuit, the step voltage regulator configured to provide a constant voltage drop across the step voltage regulator referenced to a voltage level at the input of the step voltage regulator, the step voltage regulator circuit further comprising:
         a p-channel field effect transistor (PFET) comprising a source input, gate input and drain output, wherein the source input of the PFET is electrically connected to the cathode of power supply, the drain output of the PFET is electrically connected to the input of the static random access memory circuit; and
         a switch device comprising at least three inputs and an output, the output of the switch device electrically connected to the gate input of the PFET, a first input of the switch device electrically connected to the drain output of the PFET such that when the switch is in a first configuration, the gate input of the PFET is electrically connected to the drain output of the PFET, a second input of the switch device electrically connected to the cathode of the power supply such that when the switch is in a second configuration, the gate input of the PFET is electrically connected to the cathode of the power supply, and a third input of the switch device electrically connected to the anode of the power supply such that when the switch is in a third configuration, the gate input of the PFET is electrically connected to the anode of the power supply;
      wherein the voltage across the static random access memory circuit varies with reference to variations of a power signal provided by the power supply.

8. The computer system of claim 7 wherein the static random access memory circuit provides a parasitic decoupling capacitance to the power supply due to the varying voltage across the static random access memory circuit.

9. The computer system of claim 7 wherein the voltage at the output of the step voltage regulator circuit due to the constant voltage drop across the step voltage regulator is less than the voltage at the input of the step voltage regulator but more than a retention voltage of the static random access memory circuit.

10. A circuit comprising:
    a power supply comprising a cathode and an anode;
    a static random access memory circuit comprising an input electrically connected to the cathode of the power supply and an output; and
    a step voltage regulator circuit comprising an input electrically connected to the output of the static random access memory circuit and an output electrically connected to the anode of the power supply, the step voltage regulator configured to provide a constant voltage drop across the step voltage regulator referenced to a voltage level at the output of the step voltage regulator, the step voltage regulator circuit further comprising:
- a p-channel field effect transistor (PFET) comprising a source input, gate input and drain output, wherein the source input of the PFET is electrically connected to the cathode of power supply, the drain output of the PFET is electrically connected to the input of the static random access memory circuit; and
- a switch device comprising at least three inputs and an output, the output of the switch device electrically connected to the gate input of the PFET, a first input of the switch device electrically connected to the drain output of the PFET such that when the switch is in a first configuration, the gate input of the PFET is electrically connected to the drain output of the PFET, a second input of the switch device electrically connected to the cathode of the power supply such that when the switch is in a second configuration, the gate input of the PFET is electrically connected to the cathode of the power supply, and a third input of the switch device electrically connected to the anode of the power supply such that when the switch is in a third configuration, the gate input of the PFET is electrically connected to the anode of the power supply;

wherein the voltage across the static random access memory circuit varies with reference to variations of a power signal provided by the power supply.

11. The circuit of claim 10 wherein the static random access memory circuit provides a parasitic decoupling capacitance due to the varying voltage across the static random access memory circuit.

* * * * *